(12) United States Patent
Cho et al.

(10) Patent No.: US 8,232,566 B2
(45) Date of Patent: Jul. 31, 2012

(54) LIGHT EMITTING DEVICE, PACKAGE, AND SYSTEM

(75) Inventors: Hyun Kyong Cho, Seoul (KR); Chang Hee Hong, Seoul (KR); Hyung Gu Kim, Jeonbuk (KR)

(73) Assignee: LG Innotek Co., Ltd., Seoul (KR)

( * ) Notice: Subject to any disclaimer, the term of this patent is extended or adjusted under 35 U.S.C. 154(b) by 143 days.

(21) Appl. No.: 12/772,532

(22) Filed: May 3, 2010

(65) Prior Publication Data

US 2010/0276726 A1 Nov. 4, 2010

(30) Foreign Application Priority Data

May 4, 2009 (KR) .................. 10-2009-0039014
Mar. 15, 2010 (KR) .................. 10-2010-0022922

(51) Int. Cl.
*H01L 33/00* (2010.01)

(52) U.S. Cl. .......... 257/88; 257/103; 257/200; 257/613; 257/E21.006; 257/E21.042; 257/E21.085; 257/E21.17; 257/E21.126; 257/E21.127; 257/E21.329; 257/E21.352

(58) Field of Classification Search .............. 257/40, 257/88, 103, 200, 201, 347, 613, 614, 615, 257/E21.006, E21.042, E21.085, E21.126, 257/E21.127, E21.329, E21.352
See application file for complete search history.

(56) References Cited

U.S. PATENT DOCUMENTS

| | | | | |
|---|---|---|---|---|
| 6,316,792 | B1 * | 11/2001 | Okazaki et al. | 257/99 |
| 6,891,871 | B1 * | 5/2005 | Nomura et al. | 372/45.01 |
| 7,511,311 | B2 * | 3/2009 | Kususe et al. | 257/95 |
| 2004/0048409 | A1 | 3/2004 | Biwa et al. | |
| 2005/0017253 | A1 * | 1/2005 | Hata | 257/80 |

FOREIGN PATENT DOCUMENTS

| | | |
|---|---|---|
| EP | 0 977 277 A1 | 2/2000 |
| JP | 64-061979 | 3/1989 |
| JP | 04-273174 | 9/1992 |
| JP | 7038149 | 2/1995 |
| JP | 2000-68593 | 3/2000 |
| JP | 2001-36129 | 9/2001 |
| JP | 2004-274042 | 9/2004 |
| WO | WO 2009/028860 A2 | 3/2009 |

OTHER PUBLICATIONS

Korean Office Action dated Jan. 11, 2011.
European Search Report for 10161794.2-2222 dated Apr. 11, 2011.
Korean Office Action dated Aug. 29, 2011.

* cited by examiner

*Primary Examiner* — David Nhu
(74) *Attorney, Agent, or Firm* — KED & Associates LLP

(57) ABSTRACT

A light emitting device includes a first semiconductor layer of a first conductivity type, an active layer adjacent to the first semiconductor layer, a second semiconductor layer of a second conductivity type and provided adjacent to the active layer, and a passivation layer provided on a side surface of the active layer. The passivation layer may be a semiconductor layer of one of the first conductivity type, the second conductivity type or a first undoped semiconductor layer. A first electrode may be coupled to the first semiconductor layer and a second electrode may be coupled to the second semiconductor layer.

16 Claims, 9 Drawing Sheets

[FIG. 1]
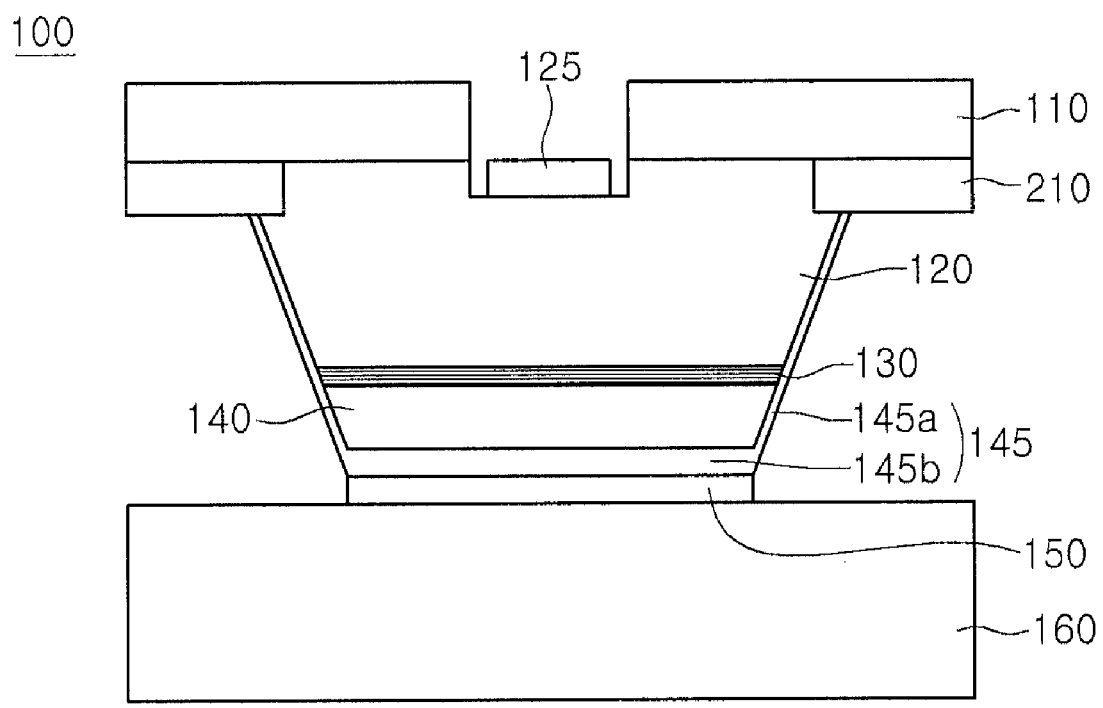
[FIG. 2]
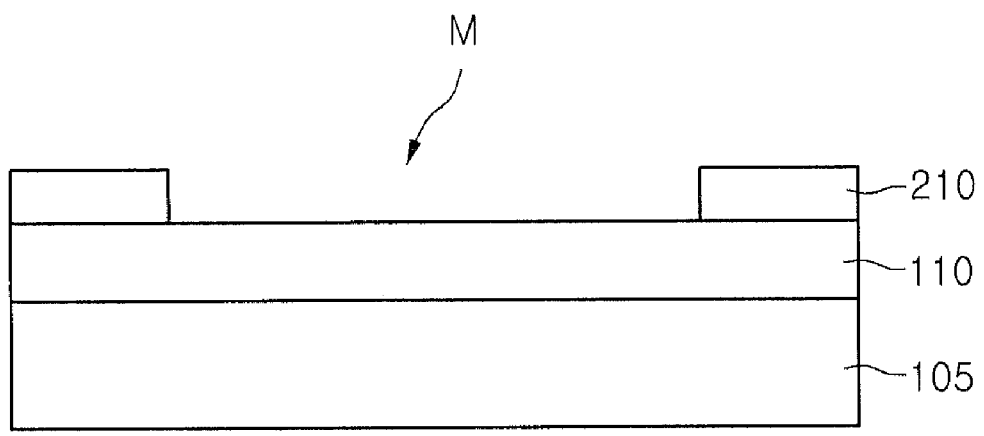

[FIG. 3]
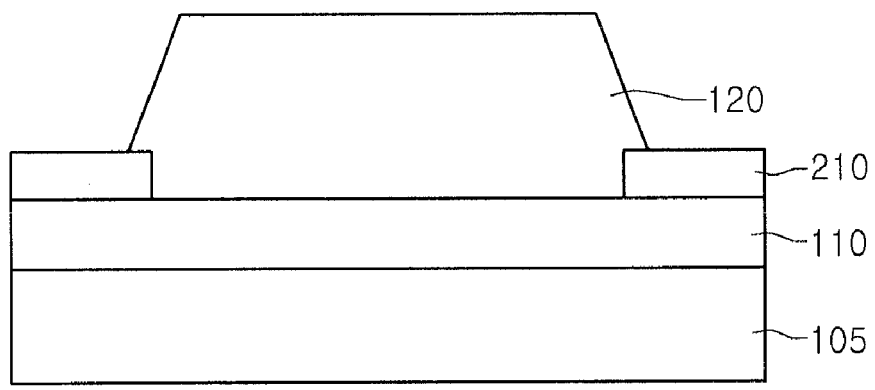
[FIG. 4]
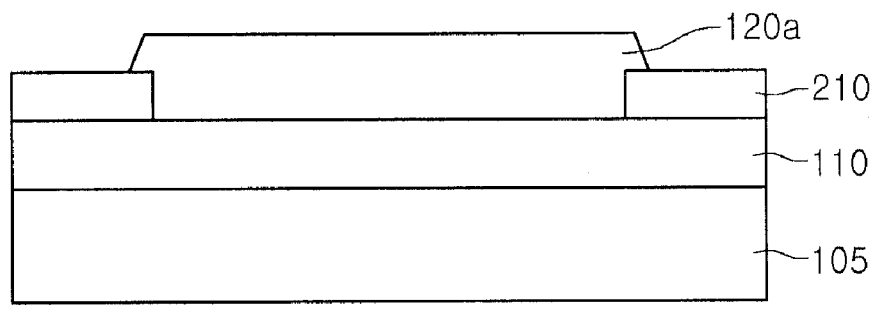
[FIG. 5]
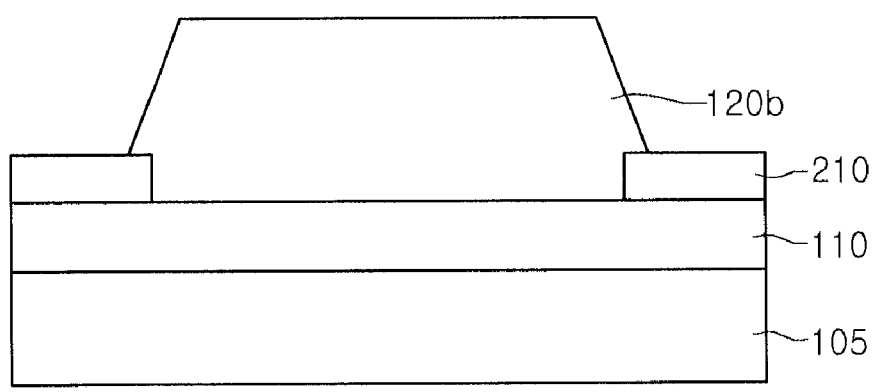

[FIG. 6]
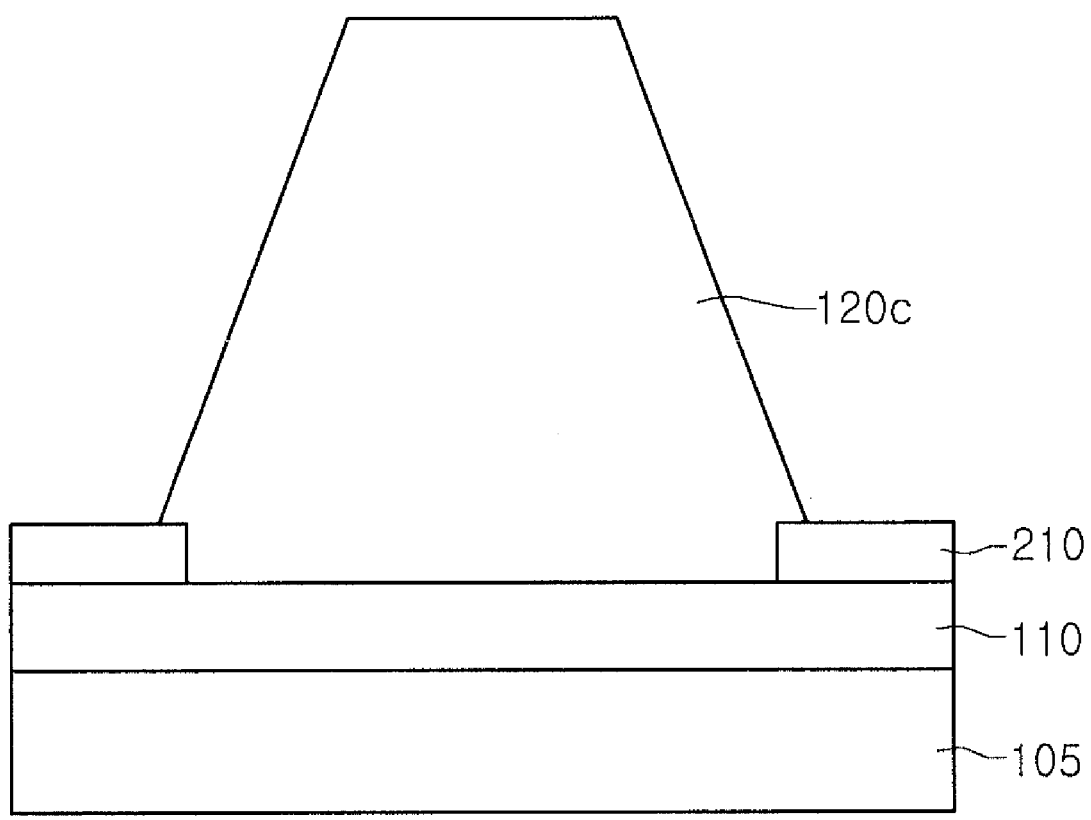

【FIG. 7】
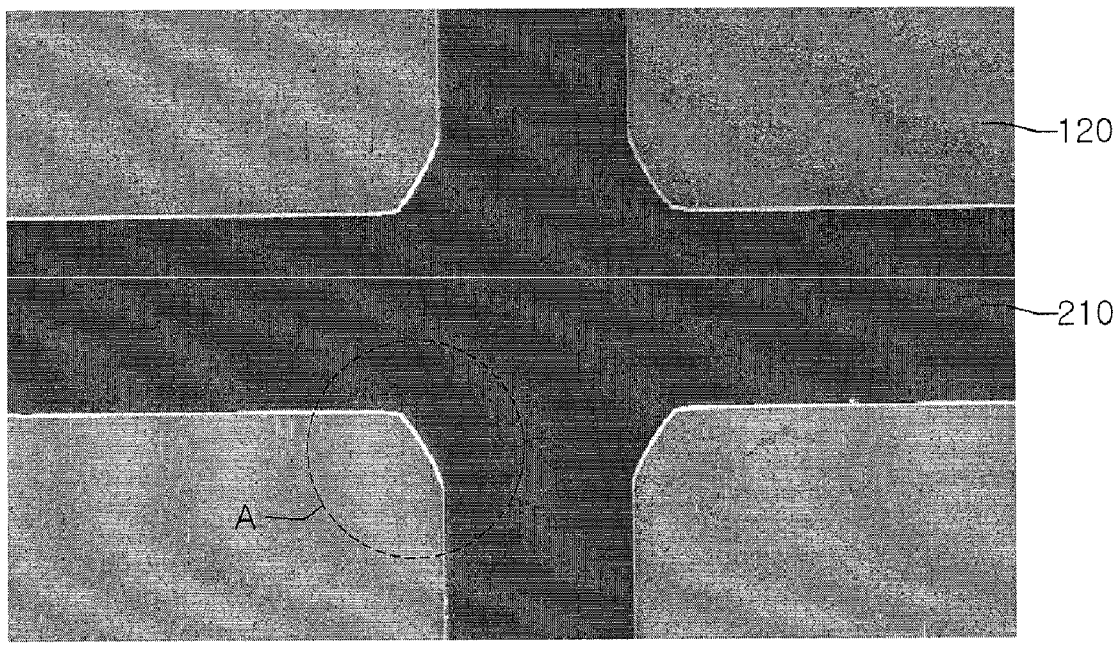
【FIG. 8】
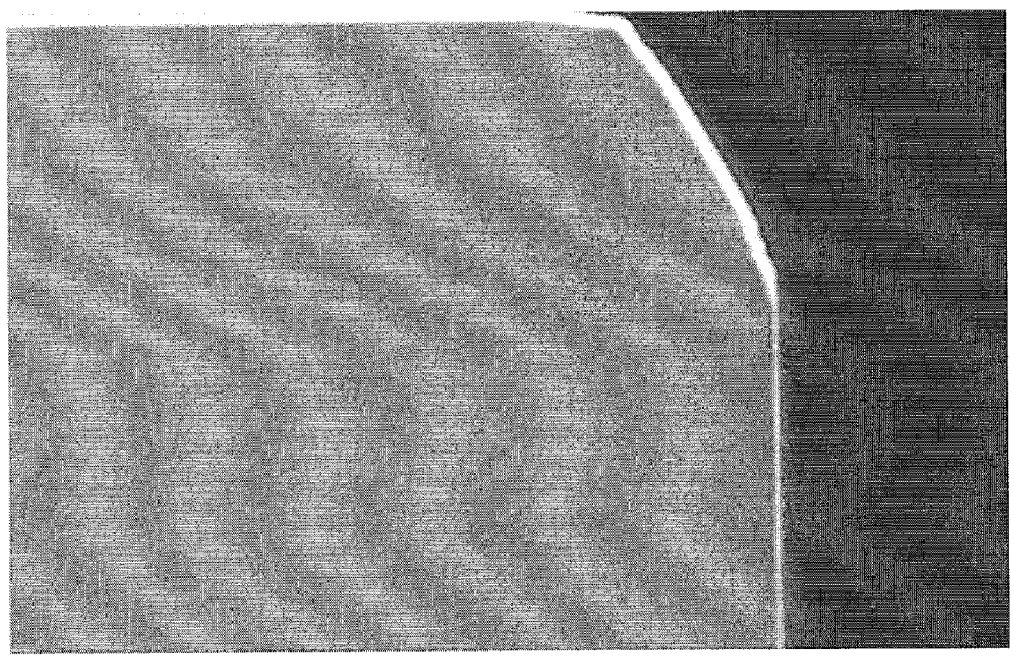

[FIG. 9]
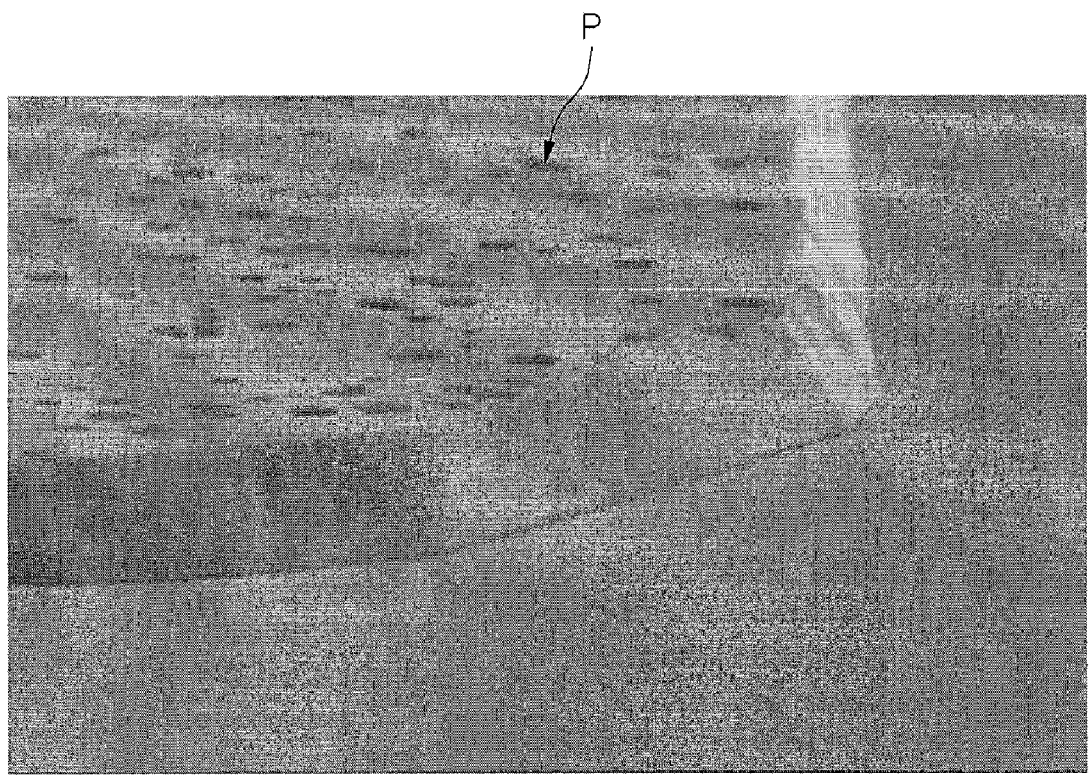
[FIG. 10]
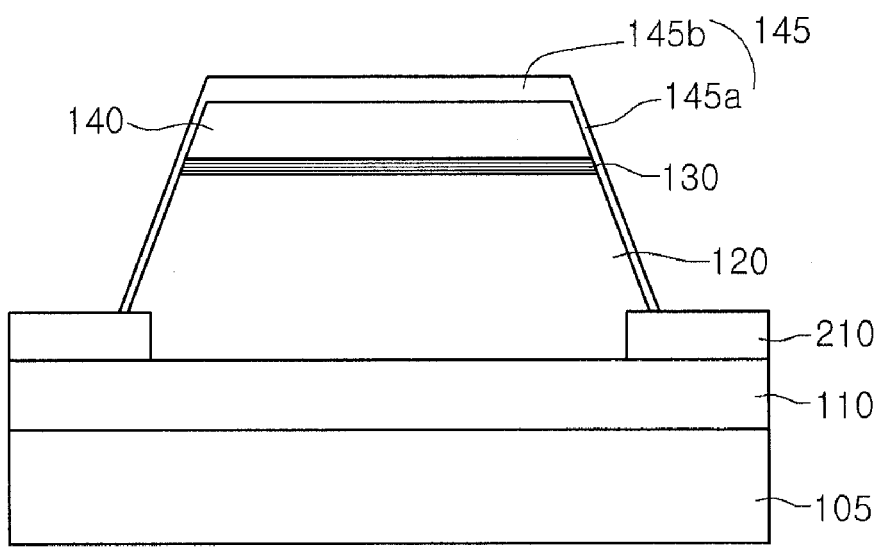

[FIG. 11]
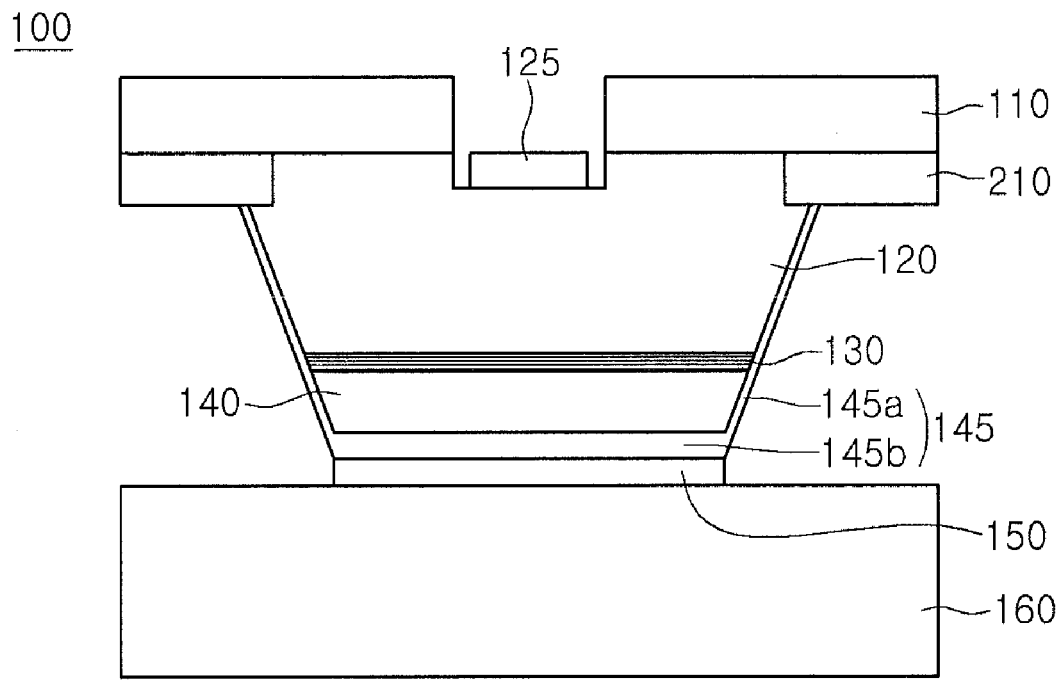
[FIG. 12]
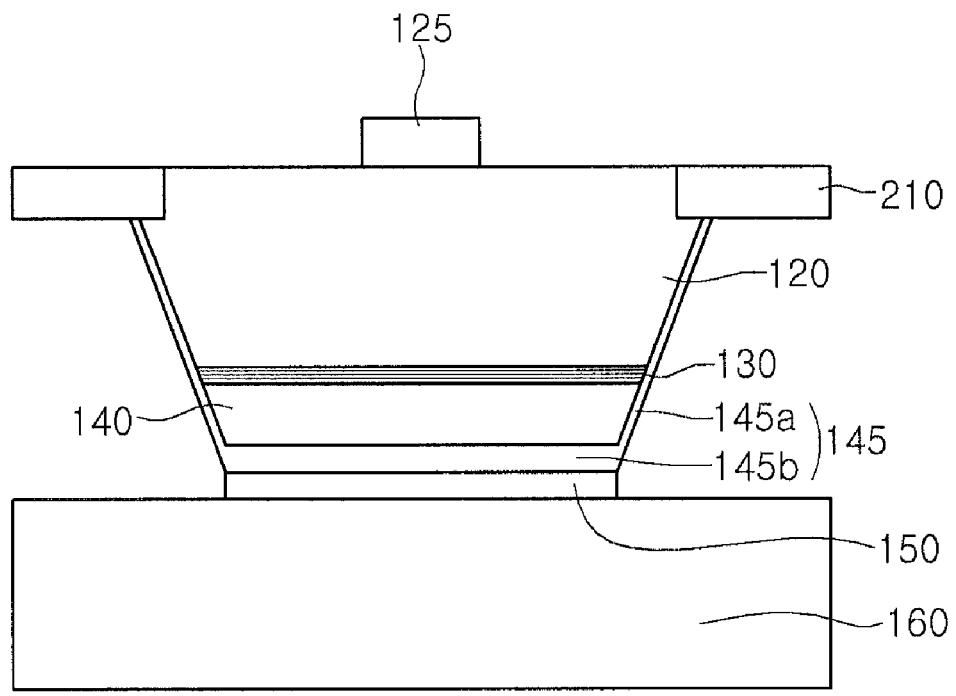

[FIG. 13]
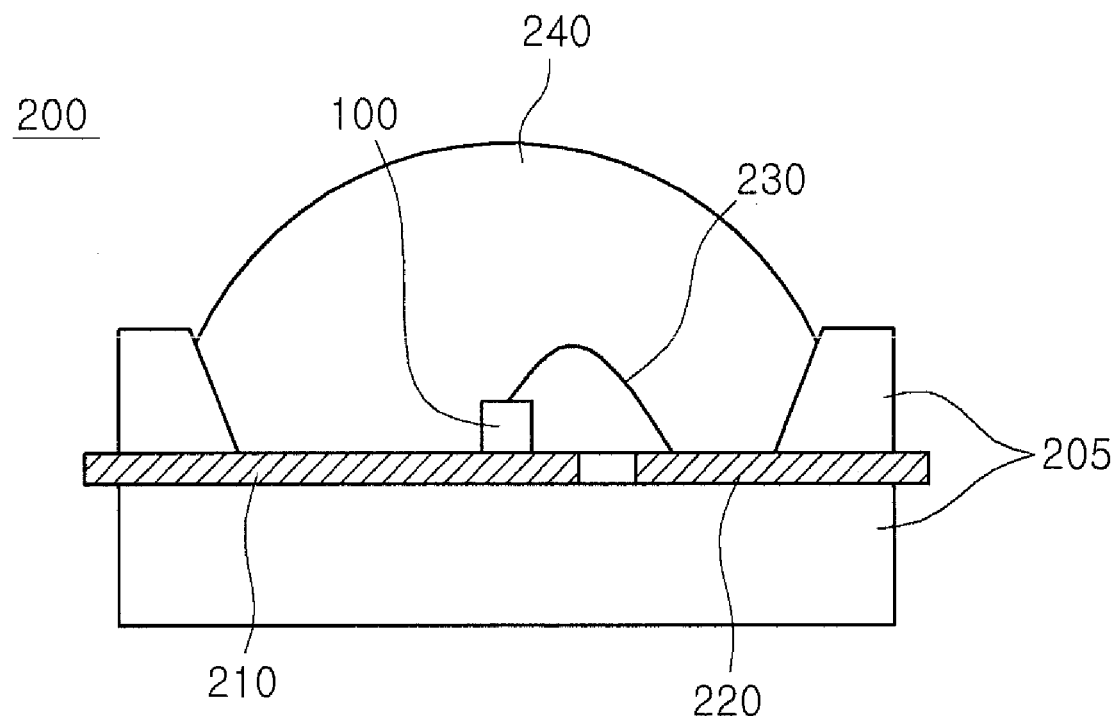

【FIG. 14】
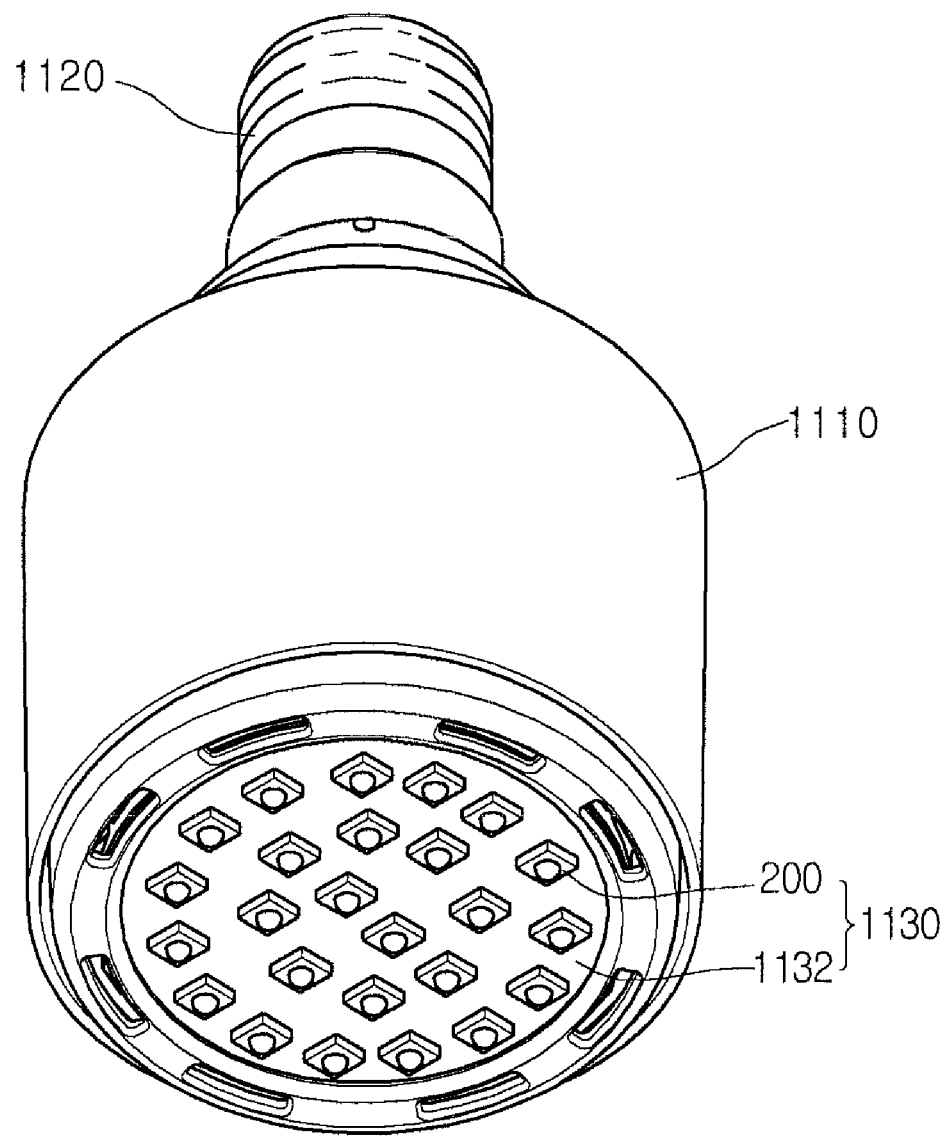

[FIG. 15]
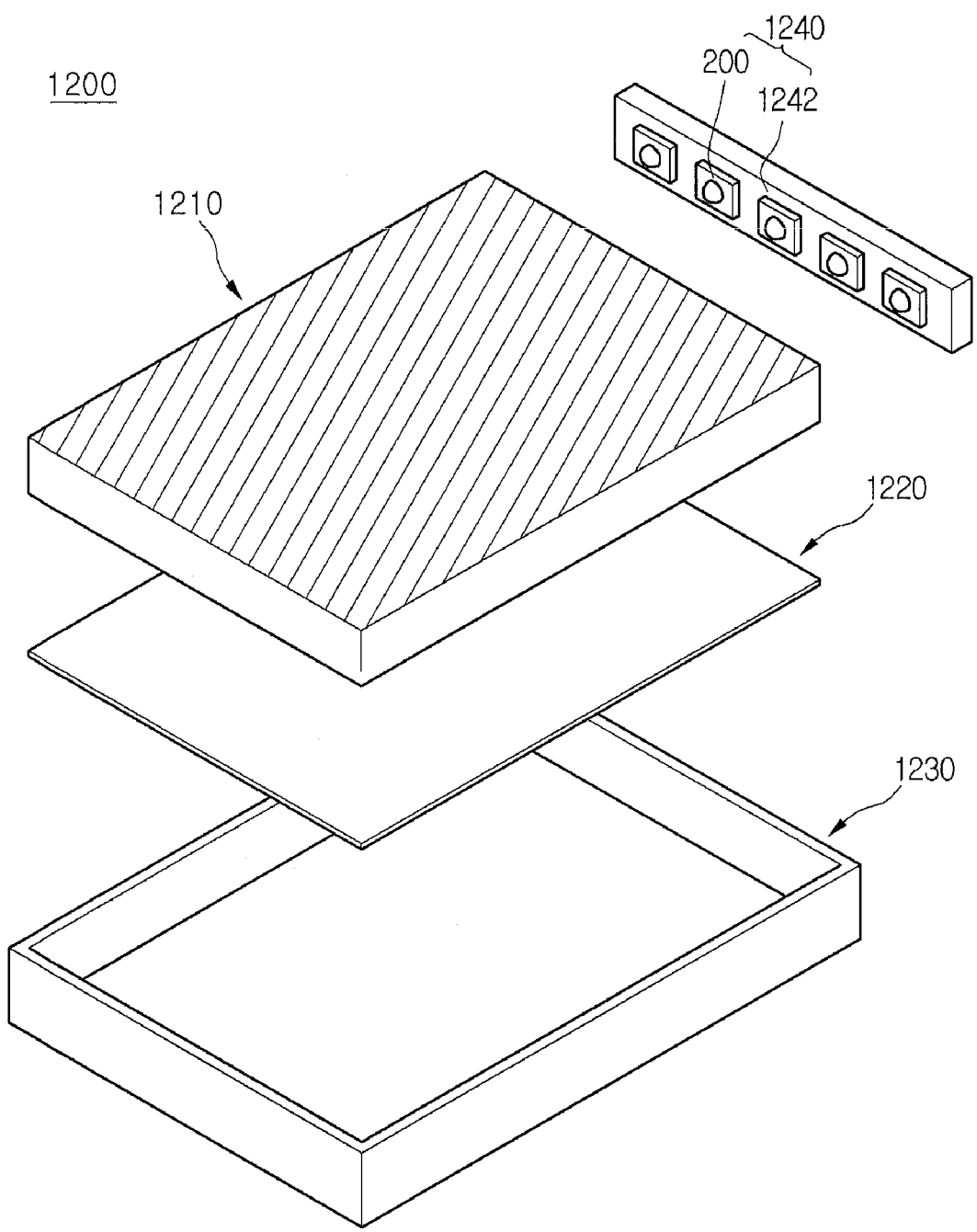

LIGHT EMITTING DEVICE, PACKAGE, AND SYSTEM

CROSS-REFERENCE TO RELATED APPLICATIONS

The present application claims the benefit under 35 USC §119 of Korean Patent Application No. 10-2009-0039014, filed May 4, 2009, and 10-2010-0022922, filed Mar. 15, 2010, the contents of which are incorporated herein by reference.

BACKGROUND

1. Field

One or more embodiments described herein relate to emission of light by a device, package or system.

2. Background

Light emitting devices generate light when electrons from an n-layer combine with holes from a p-layer. While these devices are in widespread use, they have defects. For example, threading dislocations can occur in epitaxial layers as a result of non-uniform thermal expansion and crystal lattice coefficients. Selective epitaxial growth methods have been used in an attempt to overcome these drawbacks, but they have proven ineffective.

Also, passivation processes have been used to protect active layers in the device. However, these layers do not adhere well and tend to deform in heat. Moreover, dielectric films in these devices are often affected by interfacial stress during deposition.

BRIEF DESCRIPTION OF THE DRAWINGS

FIG. 1 is a diagram showing one embodiment of a light emitting device.

FIGS. 2 to 6 and 10 to 11 are diagrams showing sectional views produced by one embodiment of a method for manufacturing a light emitting device.

FIGS. 7 and 8 are photographs that respectively show a top surface of one embodiment of a light emitting device.

FIG. 9 is a photograph of another type of light emitting device.

FIG. 12 is a diagram showing another embodiment of a light emitting device.

FIG. 13 is a diagram of one embodiment of a light emitting device package.

FIG. 14 is a diagram of one embodiment of a lighting unit.

FIG. 15 is a diagram of one embodiment of a backlight unit.

DETAILED DESCRIPTION

FIG. 1 shows one embodiment of a light emitting device (LED) 100 which includes include a light emitting structure having a semiconductor layer 120 of a first conductivity type, an active layer 130, and a semiconductor layer 140 of a second conductivity type, and a protective layer 145 formed over the light emitting structure.

The light emitting device of FIG. 1 may be formed without a step between a center and edge during selective epitaxial growth. By forming a passivation layer from the same type of material as a light emitting structure, the manufacturing process of the light emitting device may be simplified and adhesion between the passivation layer and the light emitting structure may be increased.

One embodiment of a method for manufacturing a light emitting device such as shown in FIG. 1 will now be described with reference to FIGS. 2 to 11. This device may be formed of a material in Groups III-V materials, e.g., GaN, GaAs, GaAsP, and GaP materials. For example, Green-Blue LEDs may be formed from GaN (InGaN) and Yellow-Red LEDs may be formed from InGaAlP or AlGaAs, and full color reproduction is possible by altering material composition.

In an initial step, a first substrate 105 is provided for the light emitting structure as shown in FIG. 2. As an example, the first substrate 105 may be a sapphire ($Al_2O_3$) single crystal substrate, an Si substrate, an SiC substrate, a GaN substrate, a $Ga_3O_3$, etc., but different materials may be used in other embodiments. Wet etching may be performed on the first substrate 105, and the surface may be removed of impurities. The substrate 105 may have a buffer layer formed thereon.

An undoped semiconductor layer 110 (e.g., an undoped GaN layer) is formed on first substrate 105. By forming the undoped semiconductor layer 110, the process to grow semiconductor layer 120 to be subsequently formed may be improved, and an upward expansion of crystal defects may be prevented. The formation of undoped semiconductor layer 110 may be optional.

A first pattern 210 is formed on undoped semiconductor layer 110 to expose a partial region M. The first pattern 210 may be left on boundary regions between chips. The first pattern 210 may be, for example, an oxide layer such as $SiO_2$ or a nitride layer such as SiN, but other materials may be used. According to one embodiment, the first pattern 210 that exposes a partial region may be formed by depositing $SiO_2$ using PECVD (Plasma-Enhanced Chemical Vapor Deposition) and then patterning may be performed.

Next, as shown in FIG. 3, semiconductor layer 120 of the first conductivity type is formed on the exposed portion of undoped semiconductor layer 110. For example, a first undoped semiconductor layer 120 may be formed using a method such as CVD (Chemical Vapor Deposition), MBE (Molecular Beam Epitaxy), sputtering, HYPE (Hydride Vapor Phase Epitaxy), etc. For example, the first conductive semiconductor layer may be formed by injecting trimethyl gallium gas (TMGa), ammonia gas ($NH_3$), nitrogen gas ($N_2$), and silane gas ($SiH_4$) including an N-type impurity such as silicon Si into a chamber.

In one embodiment, semiconductor layer 120 may be grown from a seed region, being the exposed undoped semiconductor layer 110, sideways toward the first pattern 210 and upward on the substrate 105. For example, when semiconductor layer 120 is selectively grown vertically and horizontally along first pattern 210 and first substrate 105, the TD (Threading Dislocation) at horizontal growth regions toward the first pattern 210 is bent or blocked by the first pattern 210, to prevent surface dislocation lines or cracking. As a result, semiconductor layer 120 may be high quality crystallization with virtually no dislocation.

In accordance with one or more embodiments, a selective region growing method may be used and a GaN-based material with low crystal defects may be grown as an LED structure, in order to achieve high internal efficiency and high reliability and to enable good current spreading.

Because edge growth is prevalent in selective epitaxial growth, in order to reduce the step that is formed between the center and edge of other types of devices, semiconductor layer 120 may be formed under a pressure of about 100 mbar or below. Accordingly, as shown in FIG. 3, a step between center and edge of the semiconductor layer 120 may barely be formed, if at all.

FIGS. 4 to 6 are exemplary diagrams showing semiconductor layer 120 grown over time. FIG. 4 shows semiconductor layer 120a after about 10 minutes of growth, FIG. 5 shows semiconductor layer 120b after about 30 minutes of growth, and FIG. 6 shows semiconductor layer 120c after about 60 minutes of growth.

FIG. 7 is a photograph of a top surface of a light emitting device formed in accordance with one or more of the foregoing embodiments, and FIG. 8 is a photograph showing an enlarged view of region A in FIG. 7. When growing a large-area LED including layer 120 having a horizontal width of about 1 mm and a first pattern 210 having a width of about 90 µm, the step between center and edge may be maintained at less than about 500 nm according to one example.

The semiconductor layer 120 may be grown at a temperature of about 1100° C. or higher. The temperature may be maximally raised in equipment used for forming semiconductor layer 120 such as during MOCVD (Metal-Organic Chemical Vapor Deposition) of the semiconductor layer. As shown in FIG. 8, during LED growth, there is virtually no step formed between the center and edge and improved surface morphology can therefore be realized.

In accordance with one embodiment, semiconductor layer 120 can be formed using a Group III to Group V element quantitative ratio (V/III) of about 2,000. Doing so may cause virtually no step to be formed between the center and edge, and therefore surface morphology may be improved during growth of a light emitting device.

The quantitative ratio (V/III) of the Group III element to the Group V element may be varied according to temperature, pressure, and type of gas. For example, controlling the flow volume of TMGa gas and $NH_3$ gas will allow for control of the ratio (V/III) of the Group III element quantity to the Group V element quantity.

FIG. 9 shows a state in which surface morphology has deteriorated and V-pitting (P) has increased, when the quantitative ratio of the Group III element to the Group V element was between about 2,200 and about 2,300. By controlling the growing temperature, pressure, or quantitative ratio of Group III element to Group V element during selective epitaxial growth, no step between the center and edge may be formed.

As shown in FIG. 10, active layer 130 is formed on semiconductor layer 120. The active layer 130 may have a single or multi quantum well structure formed of nitride semiconductor thin film layers with mutually different energy bands that are alternately stacked once or multiple times. Alternatively, the active layer 130 may have a quantum wire structure or a quantum dot structure.

The active layer 120 may be formed in a multi quantum well structure having an InGaN wall layer/InGaN barrier layer configuration with trimethyl gallium gas (TMGa), ammonia gas ($NH_3$), nitrogen gas ($N_2$), and trimethyl indium gas (TMIn) injected, but is not limited thereto. Here, the energy band gap of the well layer may be less than the energy band gap of the barrier layer. The active layer 130 may be formed of at least one selected from InGaN/GaN, InGaN/InGaN, AlGaN/GaN, InAlGaN/GaN, GaAs/AlGaAs (InGaAs), and GaP/AlGaP (InGaP).

According to one embodiment, active layer 130 may be formed over semiconductor layer 120 using, for example, a predetermined mask pattern (not shown) formed on a side surface of semiconductor layer 120 and the active layer 130 may be formed over the semiconductor layer 120.

Next, semiconductor layer 140 of the second conductivity type is formed on active layer 130. For example, semiconductor layer 140 may be formed with a P-type GaN layer by injecting trimethyl gallium gas (TMGa), ammonia gas ($NH_3$), nitrogen gas ($N_2$), and bis ethylcyclopentadienyl magnesium (Et$Cp_2$Mg) {Mg($C_2H_5C_5H_4)_2$} in a chamber.

A protective layer 145 may be formed of the same type of material as the light emitting structure on the light emitting structure. The protective layer 145 may be made of at least one selected from undoped GaN, AlGaN, InGaN, and AlInGaN. For example, the protective layer 145 may be formed of undoped GaN, AlGaN, InGaN, AlInGaN, etc. The protective layer 145 may be formed from a same type of material as the light emitting structure. However, in alternative embodiments, the protective layer may be made from a different material.

In one embodiment, the protective layer 145 may be formed to enclose side and top surfaces of the light emitting structure. The thickness of protective layer 145a formed on the side surface of the light emitting structure may be less than the thickness of protective layer 145b formed on the top surface of the light emitting structure.

Because protective layer 145b formed on the top surface of the light emitting structure has high conductivity, it may perform a current-spreading function. Because protective layer 145a formed on the side surface of the light emitting structure is thin and has high resistance, it may serve as a passivation layer.

The side surface of a selectively grown light emitting structure may be crystallized, for example, through Wurtzite structural characteristics of GaN. In one embodiment, the side surface of the light emitting structure may have a multidirectional surface formed along a surface of first substrate 105. The characteristics of side surface growth may differ according to the surface energy and stability of surface atoms for each part of the surface. Because of a mask patterning of first pattern 210, surface growth may be inhibited and Wurtzite material characteristics for GaN may be exhibited.

For example, while 1-2 bonds of a Ga atom are broken on a side surface, 3 bonds are broken on a top surface. Because of this characteristic, side surface growth involves a very slow growth rate, which is about ⅕ to about ¹⁄₁₀ the growing speed compared to the growth rate of a top surface. Accordingly, growth of a GaN protective layer on a side surface of a light emitting structure may be formed as a very thin film with high resistance.

According to one embodiment, protective layer 145a is formed on the side surface to have high resistance in order to perform an electrical isolation function. This protective layer 145a may be formed on the side surface with a predetermined thickness of, for example, of 100 angstroms or less. An additional step may be performed for removing a portion of protective layer 145b remaining on the light emitting structure.

As shown in FIG. 11, a second electrode layer 150 is formed below semiconductor layer 140 or protective layer 145. The second electrode layer 150 may include one or more of an ohmic layer, a reflecting layer, or a bonding layer as well as other layers.

For example, second electrode layer 150 may be formed to include an ohmic layer, a single metal or a metal alloy for making hole injection efficient, metal oxides, etc. in a multiply-stacked configuration. The ohmic layer may be formed to include, for example, at least one selected from ITO, IZO (In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au, and Ni/IrOx/Au/ITO, Ni, Pt, Cr, Ti, Ag.

If the second electrode layer 150 includes a reflecting layer, it may be formed of a metal layer including Al, Ag, or an alloy including Al or Ag. Aluminum, silver, etc., may be used to effectively reflect light radiated from the active layer and greatly improve light extracting efficiency of the light emitting device.

If the second electrode layer 150 includes a bonding layer, the reflecting layer may function as a bonding layer or a bonding layer may be formed using nickel (Ni) or gold (Au).

A second substrate 160 may be included below second electrode layer 150. The second substrate 160 may be formed of a metal, a metal alloy, or a conductive semiconductor material with good electrical conductivity, to obtain efficient hole injection. For example, the second substrate 160 may be at least one selected from Cu, Cu alloy, Si, Mo, SiGe, GaN, Ga2O3, Ge, GaN, and SiC. The method of forming the second substrate 160 may employ an ECVD metal deposition method or a bonding method using eutectic metal. Also, in one embodiment, second substrate 160 may be formed so that its horizontal width is the same as undoped semiconductor layer 110.

First substrate 105 is removed to expose a portion of undoped semiconductor layer 110. The removal method for removing the first substrate 105 may be to employ Laser Lift-Off (LLO) to separate the first substrate or a chemical etching method may be used. Also, the first substrate 105 may be removed by being physically ground.

In using an LLO method, when a predetermined energy level is applied under high temperature, the energy is absorbed at the interface between first substrate 105 and the light emitting structure, so that the bonded surface of the light emitting structure is thermally separated to allow separation of the first substrate 105 and light emitting structure. Next, a portion of undoped semiconductor layer 110 is removed and a first electrode 125 is formed on semiconductor layer 120.

Because the light emitting device chip in the embodiment shown in FIG. 11 has its ends cut in a TIP (Truncated Inverted Pyramid) configuration, a rise in external quantum efficiency by 55% or more may be achieved. The chip being cut at the end in a TIP configuration following the forming of an LED according to embodiments has a large affect on light extraction.

In one embodiment, the first pattern 210 may or may not be removed, and a surface texturing may be applied to the top surface of undoped semiconductor layer 110 in order to increase light extraction efficiency. For example, first pattern 210 may be selectively removed using wet etching, and the top surface of undoped semiconductor layer 110 may be dry-etched or wet-etched on regions except for first electrode 125 to form surface texturing (not shown) thereon.

FIG. 12 shows another embodiment of a light emitting device. This device is formed using a process that does not form an undoped semiconductor layer. Alternatively, an undoped semiconductor layer is formed and then removed thereafter.

In accordance with these embodiments, a light emitting device is formed which does not produce a step between a center and during selective epitaxial growth. Also, by forming a passivation layer using the same type of material as a light emitting structure, the manufacturing process of a light emitting device is simplified and adhesiveness between the passivation layer and light emitting structure may be improved.

FIG. 13 shows one embodiment of a light emitting device package 200 with an installed light emitting device. As shown, this package includes a body portion 205, a third electrode layer 210 and a fourth electrode layer 220 installed on the body portion 205, a light emitting device 100 installed on the body portion 205 and electrically connected to the third and fourth electrode layers 210 and the fourth electrode layer 220, and a molding member 240 enclosing light emitting device 100. The body portion 205 may be formed to include a silicon material a synthetic resin material, or a metal material, and a sloped surface may be formed around the light emitting device 100. The third and fourth electrode layers 210 and 220 are electrically separated from one another and are used to supply power to light emitting device 100. The third and fourth electrode layers 210 and the fourth electrode layer 220 may reflect light radiated from light emitting device 100 to improve lighting efficiency and may perform the role of dissipating heat generated by light emitting device 100 to the outside.

The light emitting device 100 may be implemented, for example, as a vertical-type device as shown in FIG. 1 or a horizontal-type device. A light emitting device 100 may be installed on body portion 205 or may be installed on the third electrode layer 210 or the fourth electrode layer 220.

The light emitting device 100 may be electrically connected to the third electrode layer 210 and/or the fourth electrode layer 220 via a wire 230. As an example, vertical-type light emitting device 100 is connected using one wire 230 in FIG. 13.

The molding member 240 may enclose the light emitting device to protect this device. A phosphor may be included on the molding member 240 to alter the wavelengths of light radiated from light emitting device 100.

In one embodiment, the light emitting device package may be used as a lighting system such as shown in FIG. 14, as a the backlight unit as shown in FIG. 15, as traffic lights, as vehicle headlights, as signs, and more.

FIG. 14 shows one example of a lighting unit 1100 which includes a case body 1110, a light emitting module portion 1130 installed on the case body 1110, and a connecting terminal 1120 installed on the case body 1110 to supply power from an external power supply.

The case body 1110 may be formed of a material with good thermal conducting properties, and may be formed of a metal material or a resin material, for example.

The light emitting module portion 1130 may include a substrate 1132 and at least one light emitting device package 200 mounted on the substrate 1132. Substrate 1132 may have a circuit pattern printed on an insulator, and may include, for example, a PCB (Printed Circuit Board), MCPCB (Metal Core) PCB, FPCB (Flexible) PCB, CPCB (Ceramic) PCB, etc. Also, substrate 1132 may be formed of a material that efficiently reflects light, or may be formed with a color (e.g., white or silver) that efficiently reflects light from a surface.

At least one light emitting device package 200 may be mounted on substrate 1132. Each light emitting device package 200 may include at least one LED (Light Emitting Diode) 100. LEDs 100 may include colored light LEDs that respectively radiate red, green, blue, or white light, and UV (Ultraviolet) LEDs that radiate UV light.

The light emitting module portion 1130 may have a diverse combination of light emitting device packages 200 disposed thereon to yield different colors and brightnesses. For example, in order to obtain a high CRI (Color Rendering Index), white light LEDs, red LEDs, and green LEDs may be arranged in combination.

The connecting terminal 1120 may be electrically connected to the light emitting module portion 1130 to supply power. According to FIG. 14, connecting terminal 1120 may be coupled, for example, in a socket configuration by being rotated and inserted in an external socket. Further, the connecting terminal 1120 may be formed in a pin configuration to be inserted in an external power source or may be connected to an external power source through a wire.

FIG. 15 shows one embodiment of a backlight unit 1200 that includes a light guide plate 1210, a light emitting module portion 1240 providing light to the light guide plate 1210, a reflecting member 1220 below the light guide member 1210, and a bottom cover 1230 housing the light guide plate 1210, light emitting module portion 1240, and reflecting member 1220.

The light guide plate 1210 functions to diffuse light and serve as a surface light source and may be formed of a transparent material. For example, the light guide plate may be formed from or include one resin selected from acrylic resins such as PMMA (PolyMethyl MetaAcrylate), PET (PolyEthylene Terephthlate), PC (Poly Carbonate), COC (CycloOlefin Copolymer), and PEN (PolyEthylene Naphthalate).

The light emitting module portion 1240 provides light to at least one side surface of light guide plate 1210, to ultimately function as a light source for the display device on which the backlight unit is installed.

The light emitting module portion 1240 may contact the light guide plate 1210. More specifically, according to one example, the light emitting module 1240 may includes a substrate 1242 and a plurality of light emitting device packages 200 mounted on the substrate 1242, and substrate 1242 may contact light guide plate 1210. The substrate 1242 may be a PCB (Printed Circuit Board) that includes a circuit pattern (not shown) or may include an MCPCB (Metal Core) PCB or a FPCB (Flexible) PCB, etc.

The plurality of light emitting device packages 200 may be mounted on substrate 1242 so that the light emitting surfaces from which light is radiated are a predetermined distance apart from light guide plate 1210.

The reflecting member 1220 may be formed below the light guide plate 1210. The reflecting member 1220 may be formed to reflect light incident at the bottom surface of light guide plate 1210 and may improve the brightness of the backlight unit. The reflecting member 1220 may be formed, for example, of PET, PC, or PVC resin.

The bottom cover 1230 may house light guide plate 1210, light emitting module 1240, and reflecting member 1220. To this end, bottom cover 1230 may be formed, for example, in the shape of a box with an open top surface. Also, the bottom cover 1230 may be formed of a metal or resin material, and may be manufactured using a process such as press-forming or compression forming.

One or more embodiments described herein therefore provide a light emitting device with a protective layer that adheres well to a light emitting structure, and a light emitting device package and a lighting system that includes the same. One or more embodiments also provide a light emitting device with low crystal defects, a light emitting device package and a lighting system that includes the same. One or more embodiments also provide a light emitting device in which a step between a center and edge is not formed during selective epitaxial growth, and a light emitting device package, and a lighting system including the same.

In one embodiment, a light emitting device comprises a light emitting structure comprising a light emitting structure comprising a first conductive semiconductor layer, an active layer, and a second conductive semiconductor layer; and a protective layer over the light emitting structure, of the same type of material as the light emitting structure.

In another embodiment, a light emitting device package comprises a light emitting device comprising a light emitting structure and a protective layer formed of the same type of material as the light emitting structure over the light emitting structure, the light emitting structure comprising a first conductive semiconductor layer, an active layer, and a second conductive semiconductor layer; and a package body where the light emitting device is disposed.

In another embodiment, a lighting system comprises a light emitting module portion comprising a light emitting device comprising a protective layer over a light emitting structure and formed of the same type of material as the light emitting structure, and a package body where the light emitting device is disposed.

In the embodiments described herein, the first and second conductivity types are selected from the group consisting of an n-type and a p-type. Also, in at least one embodiment, the semiconductor layer provided on the side may serve as a passivation layer and the semiconductor layer on the top of the second semiconductor may serve as a protective layer, which has a larger thickness.

In accordance with another embodiment, a light emitting device comprises a first semiconductor layer of a first conductivity type; an active layer adjacent to the first semiconductor layer; a second semiconductor layer of a second conductivity type and provided adjacent to the active layer; a passivation layer provided on a side surface of the active layer, the passivation layer being a semiconductor layer of one of the first conductivity type, the second conductivity type or a first undoped semiconductor layer; a first electrode coupled to the first semiconductor layer; and a second electrode coupled to the second semiconductor layer.

The passivation layer comprises $Al_xIn_yGa_{1-x-y}N$, where $0 \leq x \leq 1$, $0 \leq y \leq 1$, and $0 \leq x+y \leq 1$ and a protective layer may be provided on the second semiconductor layer.

Also, a largest width of the first semiconductor layer is greater than the largest width of at least one of the active layer or the second semiconductor layer. The largest width of the active layer is greater than the largest width of the second semiconductor layer.

Also, the side surfaces of the first semiconductor layer, the active layer and the second semiconductor layer may be tapered, and the first semiconductor layer may have a side surface which overlaps at least one oxide.

Also, a second undoped semiconductor layer may be included on the first semiconductor layer and the protective layer may be made of a same material as the passivation layer and may have a thickness greater than the passivation layer. Also, the passivation layer may be provided on a side surface of at least one of the first semiconductor layer or the second semiconductor layer.

Also, the second undoped semiconductor layer may include an opening to expose the first semiconductor layer and the first electrode is provided in the opening to contact the first semiconductor layer. The second electrode may be provided on the protective layer. A thickness of the passivation layer may be no greater than 100 angstroms. Also, the second electrode may contacts at least one of the protective layer or the second semiconductor layer.

In accordance with another embodiment, a light emitting device package may include a light emitting device in accordance with any of the aforementioned embodiments and a package body where the light emitting device is disposed.

In accordance with another embodiment, a lighting system may include a light emitting module portion comprising the light emitting device package in accordance with one or more of the aforementioned embodiments.

In the description of embodiments, it will be understood that when a layer (or film) is referred to as being 'on/over' another layer or substrate, it can be directly on/over another layer or substrate, or intervening layers may also be present. Further, it will be understood that when a layer is referred to as being 'under/below' another layer, it can be directly under/below another layer, and one or more intervening layers may also be present. In addition, it will also be understood that when a layer is referred to as being 'between' two layers, it can be the only layer between the two layers, or one or more intervening layers may also be present.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first semiconductor layer of a first conductivity type;
an active layer adjacent to the first semiconductor layer;
a second semiconductor layer of a second conductivity type and provided adjacent to the active layer;
a passivation layer provided on a side surface of the active layer, the passivation layer being a semiconductor layer of one of the first conductivity type, the second conductivity type or a first undoped semiconductor layer;
a first electrode coupled to the first semiconductor layer; and
a second electrode coupled to the second semiconductor layer, wherein the passivation layer comprises $Al_x In_y Ga_{1-x-y} N$, where $0 \leq x \leq 1$, $0 \leq y \leq 1$, and $0 \leq x+y \leq 1$.

2. The light emitting device according to claim 1, further comprising a protective layer on the second semiconductor layer.

3. The light emitting device of claim 1, wherein side surfaces of the first semiconductor layer, the active layer and the second semiconductor layer are tapered.

4. The light emitting device of claim 1, further comprising a second undoped semiconductor layer over the first semiconductor layer.

5. The light emitting device of claim 2, wherein the protective layer includes a same material as the passivation layer.

6. The light emitting device of claim 1, wherein the passivation layer is provided on a side surface of at least one of the first semiconductor layer or the second semiconductor layer.

7. The light emitting device of claim 4, wherein the second undoped semiconductor layer includes an opening to expose the first semiconductor layer, and the first electrode is provided in the opening to contact the first semiconductor layer.

8. The light emitting device of claim 2, wherein the second electrode is provided on the protective layer.

9. The light emitting device of claim 1, wherein a thickness of the passivation layer is no greater than 100 angstroms.

10. The light emitting device of claim 2, wherein the second electrode contacts at least one of the protective layer or the second semiconductor layer.

11. The light emitting device of claim 2, wherein the passivation layer has a higher resistivity than the protective layer.

12. A light emitting device, comprising:
a first semiconductor layer of a first conductivity type;
an active layer adjacent to the first semiconductor layer;
a second semiconductor layer of a second conductivity type provided adjacent to the active layer;
a passivation layer provided on a side surface of the active layer, the passivation layer being a semiconductor layer of one of the first conductivity type, the second conductivity type or a first undoped semiconductor layer;
a first electrode coupled to the first semiconductor layer; and
a second electrode coupled to the second semiconductor layer, wherein a largest width of the first semiconductor layer is greater than a largest width of at least one of the active layer or the second semiconductor layer.

13. The light emitting device of claim 12, wherein the largest width of the active layer is greater than the largest width of the second semiconductor layer.

14. The light emitting device of claim 12, further comprising:
a protective layer over the second semiconductor layer;
wherein the passivation layer has a higher resistivity than the protective layer.

15. A light emitting device, comprising:
a first semiconductor layer of a first conductivity type;
an active layer adjacent to the first semiconductor layer;
a second semiconductor layer of a second conductivity type provided adjacent to the active layer;
a passivation layer provided on a side surface of the active layer, the passivation layer being a semiconductor layer of one of the first conductivity type, the second conductivity type or a first undoped semiconductor layer;
a protective layer over the second semiconductor layer;
a first electrode coupled to the first semiconductor layer; and
a second electrode coupled to the second semiconductor layer,
wherein the protective layer has a thickness greater than the passivation layer.

16. The light emitting device of claim 15, wherein the passivation layer has a higher resistivity than the protective layer.

* * * * *